United States Patent [19]
Ochotta et al.

[11] Patent Number: 6,069,490
[45] Date of Patent: May 30, 2000

[54] ROUTING ARCHITECTURE USING A DIRECT CONNECT ROUTING MESH

[75] Inventors: Emil S. Ochotta, Campbell; Douglas P. Wieland, Sunnyvale, both of Calif.

[73] Assignee: Xilinx, Inc., San Jose, Calif.

[21] Appl. No.: 08/982,636

[22] Filed: Dec. 2, 1997

[51] Int. Cl.[7] .................................................. H03K 19/177
[52] U.S. Cl. ............................................... 326/41; 326/39
[58] Field of Search ............................................ 326/37–41

[56] References Cited

U.S. PATENT DOCUMENTS

| | | |
|---|---|---|
| Re. 34,363 | 8/1993 | Freeman . |
| 4,642,487 | 2/1987 | Carter .................................. 326/41 |
| 4,706,216 | 11/1987 | Carter . |
| 4,758,745 | 7/1988 | Elgamal et al. . |
| 4,870,302 | 9/1989 | Freeman . |
| 5,073,729 | 12/1991 | Greene et al. . |
| 5,144,166 | 9/1992 | Camarota et al. . |
| 5,208,491 | 5/1993 | Ebeling et al. . |
| 5,212,652 | 5/1993 | Agrawal et al. ...................... 326/41 |
| 5,243,238 | 9/1993 | Kean . |
| 5,260,610 | 11/1993 | Pedersen et al. . |
| 5,260,611 | 11/1993 | Cliff et al. . |
| 5,260,881 | 11/1993 | Agrawal et al. . |
| 5,267,187 | 11/1993 | Hsieh et al. . |
| 5,349,250 | 9/1994 | New . |
| 5,357,153 | 10/1994 | Chiang et al. . |
| 5,365,125 | 11/1994 | Goetting et al. . |
| 5,455,525 | 10/1995 | Ho et al. . |
| 5,457,410 | 10/1995 | Ting . |
| 5,469,003 | 11/1995 | Kean . |
| 5,581,199 | 12/1996 | Pierce et al. . |
| 5,598,109 | 1/1997 | Leong et al. ........................ 326/41 |
| 5,629,886 | 5/1997 | New . |
| 5,682,107 | 10/1997 | Tavana et al. ...................... 326/41 |
| 5,740,069 | 4/1998 | Agrawal et al. .................... 326/47 |
| 5,760,604 | 6/1998 | Pierce et al. ....................... 326/41 |
| 5,894,565 | 4/1999 | Furtek et al. ....................... 326/38 |

FOREIGN PATENT DOCUMENTS

0461798A2  6/1991  European Pat. Off. .

OTHER PUBLICATIONS

Xilinx, Inc. "The Programmable Logic Data Book" 1996, available from Xilinx, Inc., 2100 Logic Drive, San Jose, CA 95124, pp. 4–11 to 4–23 and 4–32 to 4–37.

Lucent Technologies, Microelectronics Group, ORCA, "Field–Programmable Gate Arrays Data Book," Oct. 1996, pp. 2–9 to 2–20.

Altera Corporation, "Flex 10K Embedded Programmable Logic Family Data Sheet" from the Altera Digital Library, 1996, available from Altera Corporation, 2610 Orchard Parkway, San Jose, CA 95134–2020, pp. 31–53.

G. De Micheli et al., "Design Systems for VLSI Circuits, Logic Synthesis and Silicon Compilation" 1987, Martinus Nijhoff Publishers, Dordrecht, pp. 113–195. ISBN 90–247–3561–0.

*Primary Examiner*—Michael Tokar
*Assistant Examiner*—Don Phu Le
*Attorney, Agent, or Firm*—Adam Tachner, Esq.; Crosby, Heafey, Roach & May; Lois D. Cartier

[57] ABSTRACT

A direct connect mesh routing structure is provided for interconnecting configurable logic blocks within a programmable logic device. The structure includes multi-bit interconnect busses and a highly regular structure distributed throughout a configurable array enabling high direct interconnect utilization to adjacent and non-adjacent logic blocks, high speed circuit implementation, and improved timing characteristics. The direct connections of the invention are the preferred interconnect path between logic blocks because they substantially reduce the average interconnect delay, thereby allowing the programmable logic device to operate at a higher speed.

40 Claims, 7 Drawing Sheets

ROUTING ARCHITECTURE USING A DIRECT CONNECT ROUTING MESH

CROSS REFERENCE TO RELATED APPLICATIONS

This application is related to concurrently filed and commonly assigned U.S. patent application Ser. No. 08/982,847, invented by Emil S. Ochotta and entitled "TEMPLATE-BASED SIMULATED ANNEALING MOVE-SET THAT IMPROVES FPGA ARCHITECTURAL FEATURE UTILIZATION", which is incorporated herein by reference.

This application is further related to commonly assigned co-pending U.S. patent application Ser. No. 08/806,997, invented by Steven P. Young et al and entitled "FPGA REPEATABLE INTERCONNECT STRUCTURE WITH HIERARCHICAL INTERCONNECT LINES" now issued U.S. Pat. No. 5,914,616, which is incorporated herein by reference.

FIELD OF THE INVENTION

The present invention is related generally to the field of circuit design implementation in programmable logic devices ("PLDs"), and more specifically to an interconnect architecture for a programmable logic device.

BACKGROUND OF THE INVENTION

A conventional field programmable gate array ("FPGA") is a programmable logic device that comprises a matrix of logic blocks (LBs), embedded in a configurable interconnect routing network. Control of LB configuration and the routing network define the function of the device. The device is referred to as a "field programmable" device because the array of LBs contained in the device can be configured and interconnected by the user in the user's facility by means of special hardware and software.

FPGAs are well known in the art. For example, U.S. Reissue Pat. No. 34,363 to R. Freeman, entitled "Configurable Electrical Circuit Having Configurable Logic Elements and Configurable Interconnects", assigned to Xilinx, Inc., the assignee of the present invention, describes a configurable logic array that includes a plurality of LBs variably interconnected in response to control signals to perform a selected logic function, and in which a memory is used to store the particular data used to configure the LBs.

An LB may be electrically programmed by control bits to provide any one of a plurality of logic functions. An LB may include the circuit elements necessary to provide an AND gate, flip-flop, latch, inverter, NOR gate, exclusive OR gate, and certain combinations of these functions, or an LB may include a lookup table that offers a user all functions of several input signals. The particular function performed by the LB is determined by control signals that are applied to the LB from a control logic circuit.

A conventional FPGA comprises a plurality of LBs, each LB having input leads and one or more output leads, a general interconnect structure, and a set of programmable interconnection points (PIPs) for connecting the general interconnect structure to each input lead and each output lead. Also, each lead in the general interconnect structure can typically be connected to one or more other interconnect leads by programming an associated PIP.

The various PIPs are typically programmed by loading memory cells that control the gates of pass transistors, or by connecting selected antifuses in an antifuse-based PLD. Currently, a specific FPGA configuration having a desired function is created by configuring each LB and forming paths through the interconnect structure within the FPGA to connect the LBs.

Each PIP in an FPGA is programmed by opening or closing one or more switches associated with the PIP, such that a specified signal path is defined. Such switches may be implemented by applying a control signal to the gate of a pass transistor, or, alternatively, if the switch is part of a multiplexer in which only one of several switches will be turned on at one time, several control signals may be decoded to determine which switch is turned on.

One problem with the known approaches to routing signals through an FPGA interconnect network comes from using many pass transistors to form a path. Since each transistor has an associated impedance, several pass transistors connected in series can introduce a significant impedance into a path. Additionally, each interconnect lead and pass transistor introduces a capacitive element that combines with the impedance to produce a propagation delay over the associated path. Delay is especially pronounced if a long path is required because the path may be implemented through several shorter segments and several pass transistors. There is therefore a need for an FPGA interconnect architecture that avoids the delay of available longer paths composed of a plurality of interconnected shorter paths.

In addition to avoiding long delays and more efficiently utilizing limited device resources, it is desirable to offer predictable delay. The signal path chosen to interconnect one logic element to another logic element is typically governed by algorithms implemented in software routines. The user may exercise some control over the signal paths chosen by the software, but it is typically not practical for the user to control all signal paths in an implemented design. Thus, the software must be entrusted with the significant responsibility for circuit routing and layout, and may choose any of a large number of different interconnect segment and switch combinations to realize a particular signal path. Since the number of interconnect segments and pass transistors will vary from combination to combination, the delay through the signal path may also vary significantly, depending on the choice made by the software. This variation in delay is undesirable. It would therefore be further advantageous to provide an FPGA interconnect structure that did not have significant delay differences depending upon the signal path chosen by the circuit placing and routing software.

One approach to avoiding these complications is the inclusion of direct connect structures between logic elements. Presently available direct connects connect an LB output to an adjacent LB's input, yet have very few PIPs.

For example, in the Xilinx XC3000 FPGA, each LB connects to the four LBs to its north, south, east and west, as illustrated in FIG. 1. The X output may be connected directly to the B input of the LB immediately to its right and the C input of the LB immediately to its left. Similarly, the Y output may be connected directly to the D input of the LB immediately above and the A input of the LB immediately below. Similarly, the Xilinx XC4000EX FPGA includes four direct connects per LB: two vertical and two horizontal. A simplified view of this structure is illustrated in FIG. 2. Horizontal direct connects 4 connect subject LB 2 to adjacent LB 6 on the right, and vertical direct connects 8 connect subject LB 2 to LB 10 adjacent below.

Traditional, non-direct, PIP-based connections (not shown) are also utilized in the XC4000EX FPGA, but are far slower than the available direct connect resources. For example, the delay for a single level of combinational logic using general purpose interconnect is about 2.8 ns. This delay drops to about 1.9 ns (32% faster than general purpose interconnect) when the direct connects of FIG. 2 are used.

An alternative Xilinx architecture is illustrated in FIG. 3 and described by Young, et al. in U.S. patent application Ser. No. 08/806,997 entitled "FPGA Repeatable Interconnect Structure with Hierarchical Interconnect Lines", referenced above and incorporated herein by reference. In this architecture, an LB comprises a configurable logic element (CLE), an input multiplexer (IMUX), and an output multiplexer (OMUX). There are two kinds of direct connects. Conventional direct connects 12 provide a fast path from one LB to an adjacent LB, and fast feedback paths 14 provide a fast path from the output of logic in a CLE through the associated IMUX to other logic within the same CLE. With this structure, the output of a first lookup table (LUT) within a CLE 20 can become the input to another LUT in the same CLE.

Referring still to FIG. 3, there are four horizontal direct-connects 12 driven by each LB, two in each horizontal direction. These direct connects are actually implemented as dedicated connections from an output multiplexer in one LB to input multiplexers in the adjacent LBs. In this architecture, any output of the source CLE 20 can drive any of the LUT inputs of adjacent CLE 22 through direct connects 12. This direct connect structure is more flexible than the direct connect structure in the XC4000EX of FIG. 2, but each direct connect incurs the additional delay of going through an output multiplexer.

In the architecture illustrated in FIG. 3, the advantage of using direct connects is easily revealed. The routing delay for a single level of combinational logic is approximately 2.5 ns when normal, single-length lines (not shown) are used for routing. This drops to about 2 ns (20% faster than the single-length line) when direct connects 12 are used and drops further to about 1.5 ns (40% faster than the single-length line) when fast feedback paths 14 are used.

In a minor variation of this architecture, direct connects are implemented as programmable connections from CLE outputs in one LB to input multiplexers in the adjacent LBs, thereby bypassing the output multiplexer. This implementation has reduced flexibility, but greater speed, compared to the architecture described by Young et al.

While the direct connect architectures illustrated in FIGS. 1–3 provide certain advantages, a variety of factors severely limit actual utilization of these valuable resources and call for the advancement in the art provided by the present invention. For example, previously available device fabrication processes severely limited the amount of metal available for programmable interconnection point (PIP) and direct connect implementation. However, new fabrication processes are increasing the amount of metal "real estate" available for more sophisticated routing structures. There is therefore a benefit from a direct connect interconnect structure that increases device performance while taking advantage of the new fabrication techniques. Moreover, as designs become increasingly hierarchical and contain more highly-structured components, including very tightly coupled data paths having faster local routing needs, more extensive use of direct connects would provide a significant performance enhancement. Also, a direct connect architecture having improved symmetry would be easier to model in placement and routing software than the structures described above.

SUMMARY OF THE INVENTION

A direct connect routing mesh is provided for implementation on an FPGA device. The inventive direct connect mesh replaces at least part of an existing routing fabric when used with an existing device architecture, speeding up routes that can take advantage of direct connect routing, preferably without reducing the performance of existing routing structures.

A first advantage of the present invention is the provision of a direct connect mesh having multi-bit interconnect lines.

Another advantage of the present invention is the provision of a direct connect mesh that can provide the preferred, default routing structure for a given circuit implementation.

Yet another advantage of the present invention is the provision of a direct connect mesh that provides a predictable timing model.

Still another advantage of the present invention is the provision of a direct connect mesh that can span a plurality of LBs substantially without encountering the delay of Programmable Interconnect Points.

Still another advantage of the present invention is the provision of a direct connect mesh that extends beyond adjacent LBs.

Yet another advantage of the present invention is the provision of a direct connect mesh having a highly symmetric structure, thereby enabling highly regular and predictable routing delay.

BRIEF DESCRIPTION OF THE DRAWINGS

The aforementioned advantages of the present invention as well as additional advantages thereof will be more clearly understood hereinafter as a result of a detailed description of a preferred embodiment of the invention when taken in conjunction with the following drawings in which.

DETAILED DESCRIPTION OF THE DRAWINGS

First Embodiment

Figure 4:
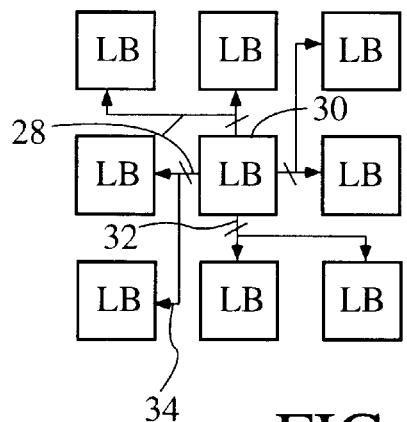
FIG. 4 illustrates a first embodiment of the present invention direct connect routing mesh.

The basic direct connect mesh 28 of the present invention is illustrated in FIG. 4. It should be noted that FIG. 4 illustrates only the direct connect mesh originating in LB 30 in the center of the figure. In application, each LB comprises the origination point for additional direct connect mesh structures 28, creating a structure wherein each LB is connected to four direct connect output segments 32 and receives eight direct connect input signals. In this embodiment, each output segment 32 of the mesh originating from an output of LB 30 has a fanout of two, allowing for user's circuit designs having internal fanout. Although fanout to a plurality of other LBs is provided, preferably the paths to all destinations are continuous wires not broken into segments connected by intermediate PIPs. Further, because each LB has multiple inputs and outputs, every segment of mesh 28 in FIG. 4 is preferably a multi-line bus having a width of at least two, increasing the count of direct connect lines to eight outputs and 16 inputs. It should be noted that this direct connect mesh structure is symmetric and extends direct connect utilization beyond adjacency in that any two LBs within a 2×2 square directly connect to one another.

Figure 3:
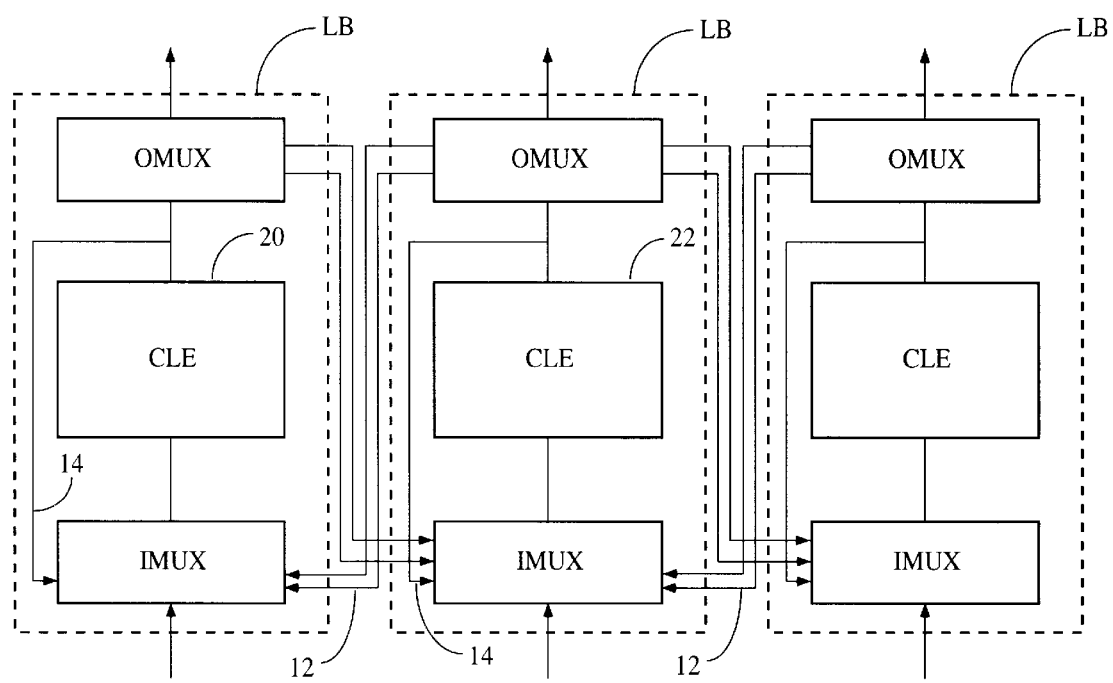
FIG. 3 illustrates an alternative direct connect structure.
Figure 5:
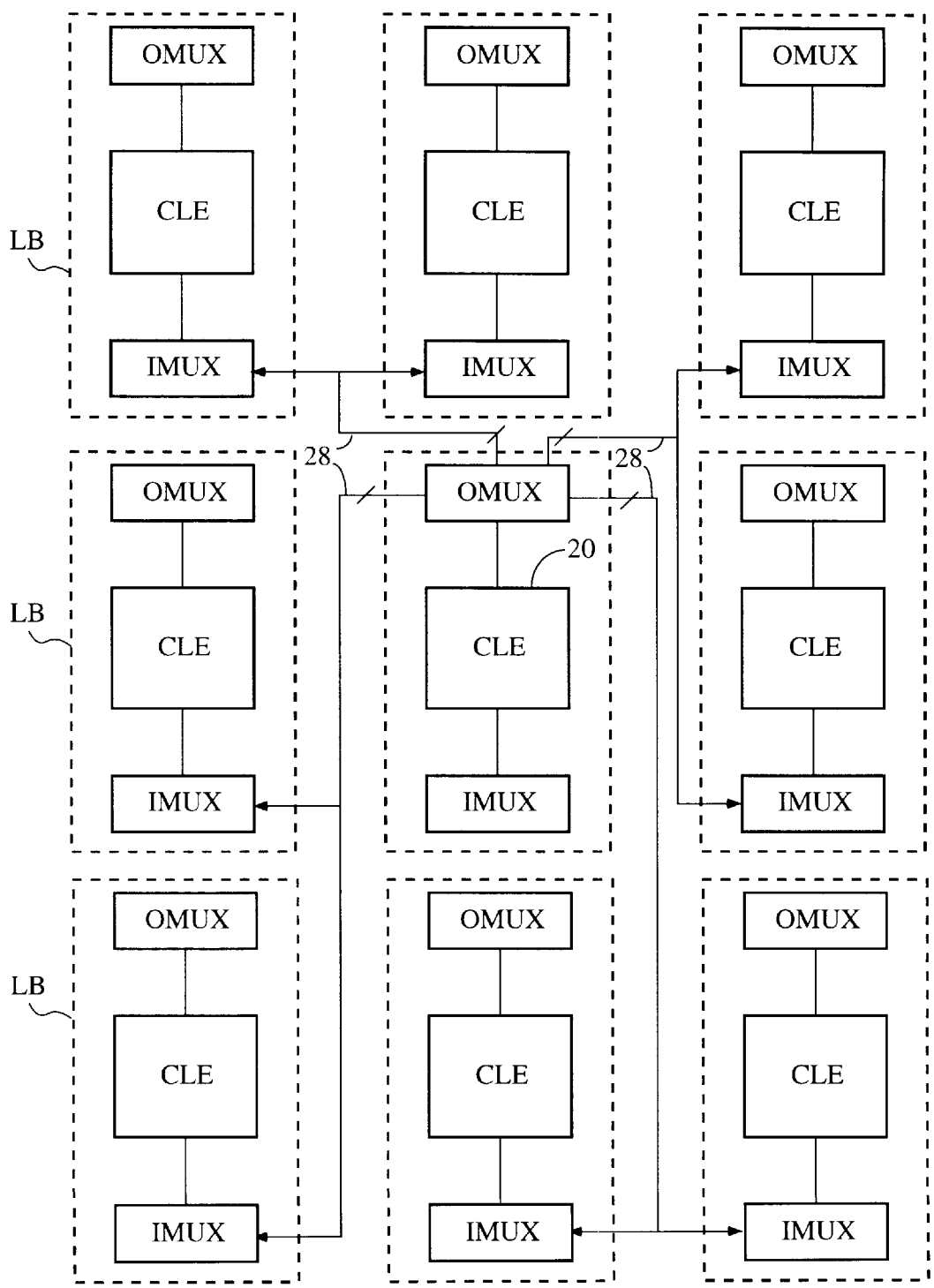
FIG. 5 illustrates the embodiment of FIG. 4 as implemented in the circuit of FIG. 3.

Referring next to FIG. 5, by adding direct connect mesh 28 to the architecture illustrated in FIG. 3, it is seen that direct connects are driven by the OMUX and any output may be routed directly to the IMUX of any adjacent LB. Preferably, an additional buffer, driven by the OMUX and driving each direct connect segment in the mesh, minimizes delay. For an embodiment where each CLE comprises four lookup tables (LUTs), each having four inputs, each IMUX requires an additional 16 inputs (for receiving 2 inputs from each of 8 adjacent CLBs), and 64 additional PIPs (each of the 16 inputs having four PIPs for providing input to the 4 LUTs). Direct connect mesh 28 thereby replaces the existing, limited direct connect structure.

Figure 5A:
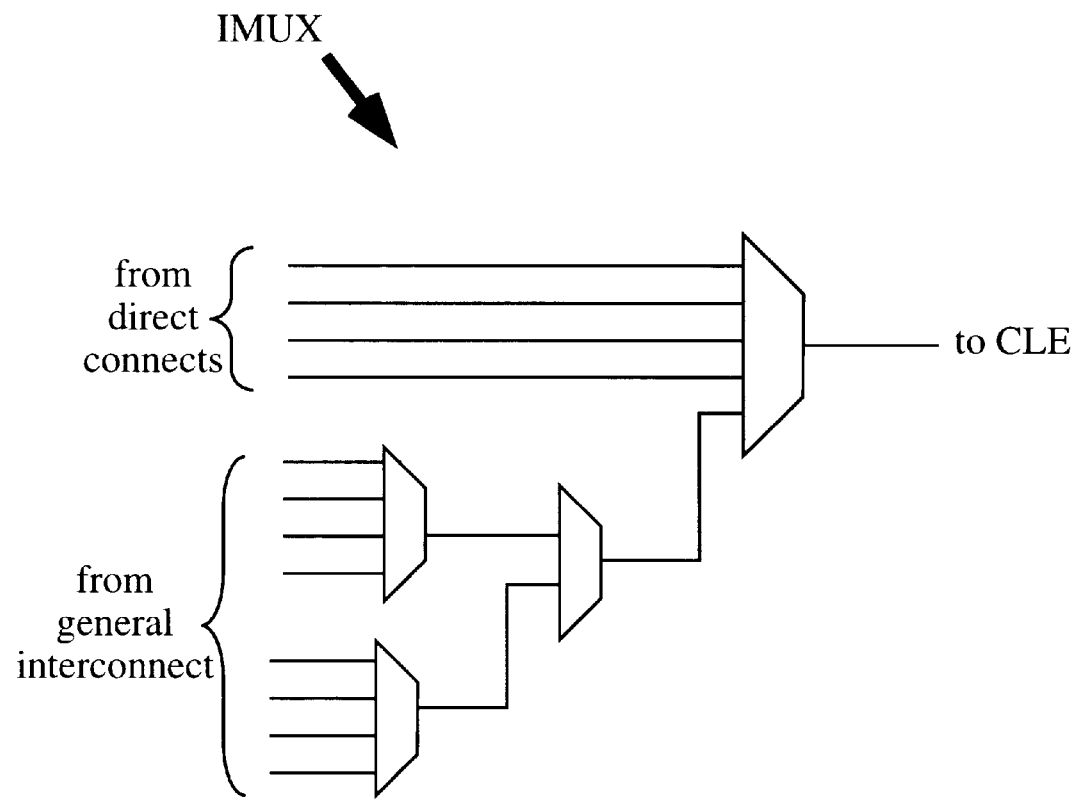
FIG. 5A illustrates a multi-level input multiplexer compatible with the structure of FIG. 5.

One option for reducing the impact of the area required for the mesh of FIG. 5 is to create a multi-level IMUX as shown in FIG. 5A by stacking several multiplexers. The multilevel IMUX of FIG. 5A passes direct connects quickly through a single multiplexer level but requires traditionally routed signals coming from greater distances to pass through multiple multiplexing levels.

Second Embodiment

Figure 6:
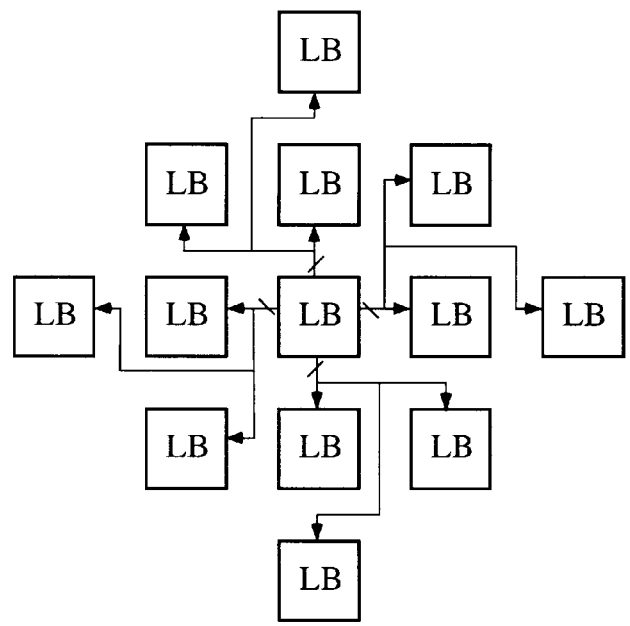
FIG. 6 illustrates a second embodiment of the present invention direct connect routing mesh.

A variation of the basic direct connect mesh 28 of the present invention is illustrated in FIG. 6. This modified embodiment can improve utilization of the direct connects with a simple placement algorithm such as simulated annealing. Available placement algorithms often use the sum of the distances in the horizontal and vertical directions (Manhattan distance) to estimate wire length, placing blocks to minimize wire length and thus minimizing routing delay. In FIG. 6, the direct connect mesh reaches all LBs within a Manhattan distance of two. As such, the Manhattan distance approximation commonly used by existing placement algorithms can accurately predict the delay achievable using the direct connect mesh of the present invention.

Third Embodiment

Figure 7:
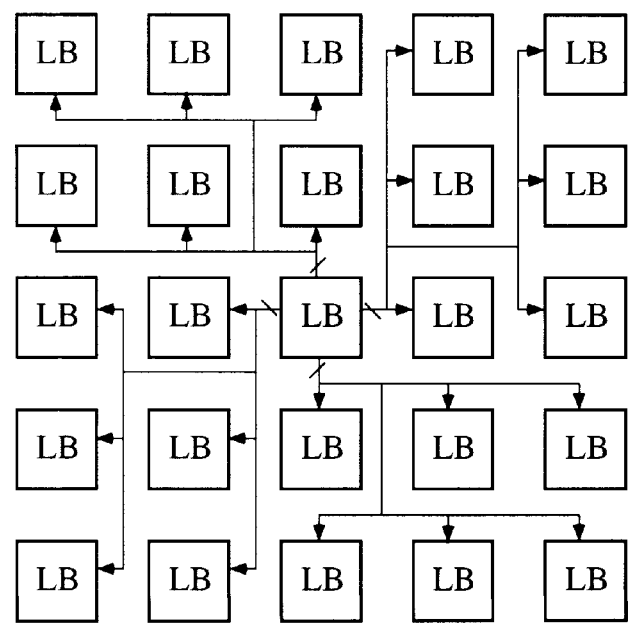
FIG. 7 illustrates a third embodiment of the present invention direct connect routing mesh.

Another embodiment of the direct connect mesh of the present invention includes still more reach and fanout, as illustrated in FIG. 7. In this embodiment, each LB has four direct connect outputs and 24 direct connect inputs. Further, each direct connect is preferably a bus with a width of at least two, increasing the count of direct connect outputs and inputs to eight and 48, respectively. It should be noted that this direct connect mesh structure is symmetric and extends direct connect utilization beyond adjacency in that any two LBs within a 3×3 quare directly connect to one another.

Figure 3A:
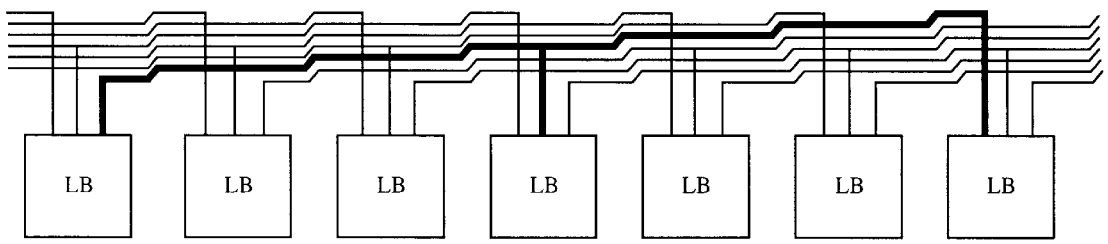
FIG. 3A illustrates an additional feature of the structure of FIG. 3.

The mesh embodiment of FIG. 7 is especially advantageous because it complements the existing hex-length routing structure of the circuit of FIG. 3, illustrated in FIG. 3A and described at length by Young et al in commonly assigned co-pending U.S. patent application Ser. No. 08/806,997, "FPGA REPEATABLE INTERCONNECT STRUCTURE WITH HIERARCHICAL INTERCONNECT LINES" now issued U.S. Pat. No. 5,914,616, which is referenced above and incorporated herein by reference. In this routing structure, hex-length lines traverse six LBs and contain a PIP at the mid-point to allow access to every third LB. As a result, without the invention single length connections are required to complete the route if the distance to the target LB is not an even multiple of three. The mesh embodiment illustrated in FIG. 7 provides direct connect access to every LB that is within a bounding box of two away. Thus, any route that uses a hex line with the device of FIG. 3 could use the direct connect mesh of FIG. 7 to more quickly complete the connection.

If a direct connect mesh were used to replace, rather than supplement, existing routing resources, a much larger number of direct connects would be utilized, along with a bus width of four or more wires. While in the invention of Young at al (U.S. patent application Ser. No. 08/806,997) this would result in 96 wires entering the input MUX, the direct connect wires of the present invention would simply replace 96 of the wires that currently enter the input MUX (see Young et al's FIG. 7).

Fourth Embodiment

In another embodiment, the direct connect mesh includes gaps to maintain the routing and reach advantage of the present invention and reduce the number of PIPs in device architectures, without overly utilizing metal layer resources. In this embodiment, not every LB in a group of LBs is necessarily directly connected to every other LB in that group. Instead, selected direct connects are intentionally omitted from the mesh to free device resources for other uses.

In still another embodiment, particular structures are targeted for the direct connect mesh during place and route of a circuit. For example, a multiplier structured across an array of LBs is particularly well suited to the high speed and density of the inventive direct connect mesh.

High direct connect mesh utilization, and therefore increased implementation speed, depends upon software placement tools. Unfortunately, using an available, unmodified optimization algorithm such as simulated annealing is fairly impractical for this application, especially where there are only two possible relative placements for a pair of blocks that can use a direct connect (as in the device architectures of FIGS. 2 and 3). By moving blocks randomly, an annealing algorithm used with a direct connect would try to find one of only two ideal solutions in a large number of random perturbations, essentially like trying to find a needle (or in this case, a pair of needles) in a haystack, and needlessly complicating placement decisions. One technique for improving direct connect utilization within the simulated annealing placement paradigm is to increase the intelligence of the algorithm by supplementing a set of random moves with moves that produce locally good solutions, while retaining a cost function and annealing mechanism to determine if the locally good solutions are also suitable on a global scale.

For example, a move can be added to an available simulated annealing placement algorithm move-set that traces an output signal with low fanout and moves all of its loads so that they can be driven by the direct connect mesh. This move works in concert with the random moves being used by the annealer and significantly increases direct connect mesh utilization when compared with an available annealing algorithm using only random moves.

Thus, a preferred modified place and route algorithm is optimized to increase direct connect mesh utilization to the extent it increases circuit implementation speed. Additional features of the modified simulated annealing algorithm and software program envisioned for use with the direct connect routing mesh of the present invention are disclosed in commonly assigned, concurrently filed, and copending U.S. patent application Ser. No. 08/982,847, entitled "TEMPLATE-BASED SIMULATED ANNEALING MOVE-SET THAT IMPROVES FPGA ARCHITECTURAL FEATURE UTILIZATION", which is referenced above and incorporated herein by reference.

Figure 8:
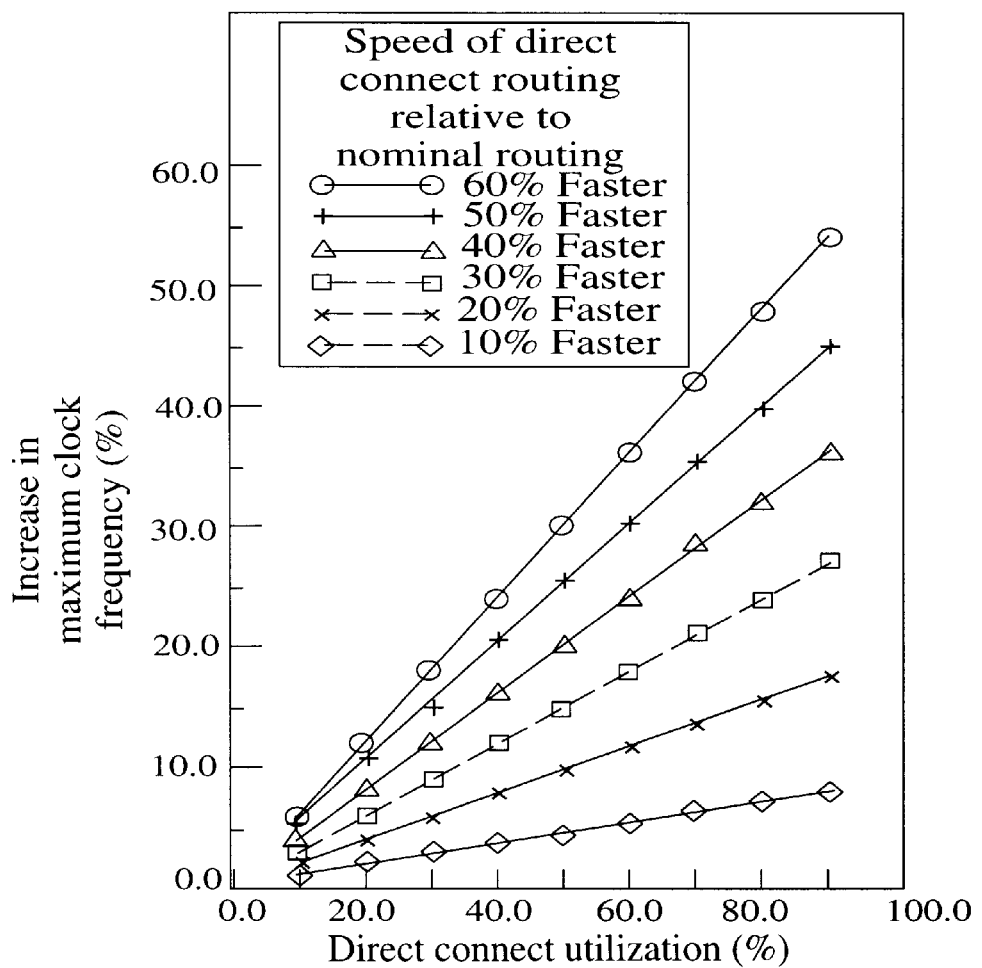
FIG. 8 illustrates the substantial benefits of increased utilization of direct connects in circuit placing and routing, as realized by the present invention.

The implementation speed advantages of the present invention should now be readily apparent. For example, with a design containing only two levels of logic, using direct connects for one of every two connections on every path will significantly increase performance. If a level of logic using direct connect routing is 30% faster than a level of logic using general purpose routing, then the design will be 15% faster overall, since half the connections on each path are sped up. The graph of FIG. 8 generalizes this relationship, the horizontal axis of the graph representing utilization of the direct connects, and the vertical axis representing overall increase in the design's maximum clock frequency. Thus, each line on the graph reflects the relative speed of logic and routing for a single level of logic with direct connect routing, as compared to the speed of logic and routing when general purpose routing is used.

Figure 1:
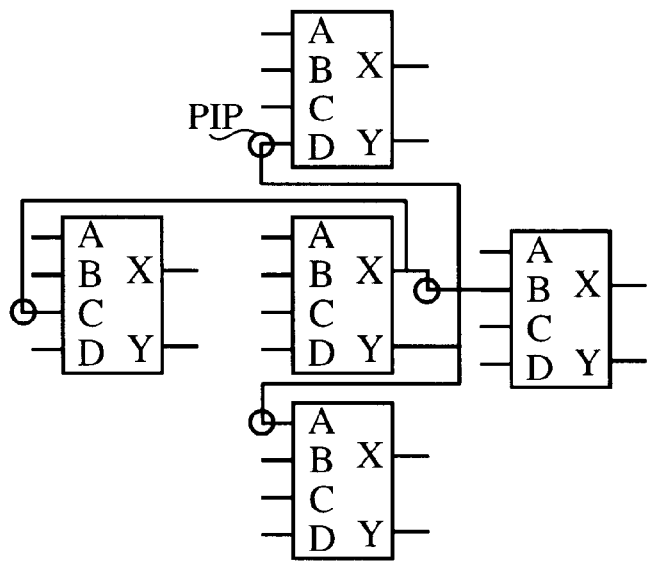
FIG. 1 illustrates a first prior art direct connect structure.
Figure 2:
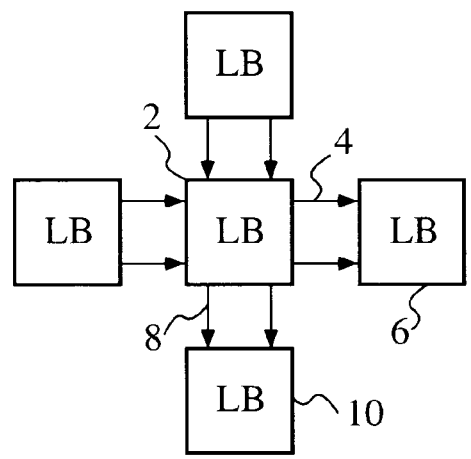
FIG. 2 illustrates a second prior art direct connect structure.

For example, for the available XC4000EX architecture shown in part in FIG. 2, a level of logic with a standard PIP connection requires 2.8 ns, while a level of logic with direct connect routing according to the invention takes only 1.9 ns. This difference represents an improvement of 32%, or about midway between the 20% and 40% lines in the graph of FIG. 8. Clearly, the greater the percentage of direct connects used across all the critical paths in the design, the greater the overall increase in the maximum clock frequency.

To maximize speed increase and other potential advantages of the present invention, the following three factors are optimally balanced in a preferred embodiment:

The preferred structure is flexible enough to handle general user netlists with fanout or similar complications, and is compatible with software to achieve high direct connect utilization on customer designs.

The preferred structure imposes minimal impact on speed of existing routing and thus increases best-case scenario routing and implementation speed, in addition to delay estimation accuracy, without substantially increasing worst-case scenario delay.

The preferred structure provides optimized speed increase over general purpose routing. This is helped by using direct connects with reach greater than a single LB. Direct connects having increased reach perform the job of several single-length PIP connections, yielding additional performance gains over general purpose routing.

While the present invention has been described with reference to certain preferred embodiments, those skilled in the art will recognize that various modifications and other embodiments may be provided. For example, the direct connect mesh can be extended to reach any plurality of Manhattan lengths having any plurality of parallel lines, as space and device architecture allow. For another example, although the embodiments described herein pertain to field programmable logic devices, the invention can also be used in other programmable logic devices such as metal programmable logic devices. These and other variations upon and modifications to the embodiments described herein are provided for by the present invention which is limited only by the following claims.

What is claimed is:

1. A programmable logic device comprising an array of rows and columns of substantially identical logic blocks, said device comprising:

at least four logic blocks not all in the same column and not all in the same row of said array, not all of said four logic blocks being adjacent to one another, each such logic block having at least one input and at least one output; and a direct interconnect structure connecting each of said four logic blocks with each other of said four logic blocks, whereby each logic block output can programmably drive said at least one input of each of said other logic blocks.

2. The programmable logic device of claim 1, wherein said four logic blocks are positioned such that they form a square.

3. The programmable logic device of claim 1, wherein:

each of said four logic blocks comprises a configurable logic element and an associated input multiplexer; and each such logic block output can programmably drive, through said direct interconnect structure, the configurable logic element in each of the other three logic blocks by traversing one such associated input multiplexer.

4. The programmable logic device of claim 1, further comprising a programmable general interconnect structure.

5. The programmable logic device of claim 1, wherein a direct interconnect path implemented in said direct interconnect structure comprises only one programmable interconnect point.

6. The programmable logic device of claim 1, wherein said direct interconnect structure comprises a bus at least two bits wide.

7. A programmable logic device comprising:

an array of logic blocks, each logic block having at least one input and at least one output; and a direct interconnect structure connecting said output of each such logic block with said input of each other such logic block within a Manhattan distance of two.

8. The programmable logic device of claim 7, wherein:

each such logic block comprises a configurable logic element and an associated input multiplexer; and each such logic block output can programmably drive, through said direct interconnect structure, the configurable logic element in each other such logic block within a Manhattan distance of two by traversing one such associated input multiplexer.

9. The programmable logic device of claim 7, further comprising a programmable general interconnect structure.

10. The programmable logic device of claim 7, wherein a direct interconnect path implemented in said direct interconnect structure comprises only one programmable interconnect point.

11. The programmable logic device of claim 7, wherein said direct interconnect structure comprises a bus at least two bits wide.

12. A programmable logic device comprising:

an array of logic blocks arranged in rows and columns, each logic block having at least one input and at least one output; and a direct interconnect structure connecting said output of a first such logic block to one of said inputs of each other such logic block located within a distance of two rows and two columns of said first logic block.

13. The programmable logic device of claim 12, wherein a direct interconnect path implemented in said direct interconnect structure comprises only one programmable interconnect point.

14. The programmable logic device of claim 12, wherein said direct interconnect structure comprises a bus at least two bits wide.

15. The programmable logic device of claim 12, wherein:
each such logic block comprises a configurable logic element and an associated input multiplexer; and
a first such logic block output can programmably drive, through said direct interconnect structure, the configurable logic element in each other such logic block located within a distance of two logic blocks of said first logic block by traversing one such associated input multiplexer.

16. The programmable logic device of claim 12, further comprising a programmable general interconnect structure.

17. A programmable logic device comprising an array of logic blocks, said device comprising:
at least four logic blocks not all adjacent to one another, each such logic block having at least one input and at least one output, said four logic blocks forming a pattern in said array of logic blocks, said four logic blocks being not all in one row and not all in one column of said array; and
a direct interconnect structure connecting each of said four logic blocks with each other of said four logic blocks, whereby each logic block output can programmably drive said at least one input of each of said other logic blocks,
wherein one such logic block can take any position in said pattern.

18. The programmable logic device of claim 17, wherein said four logic blocks are positioned such that they form a square.

19. The programmable logic device of claim 17, wherein a direct interconnect path implemented in said direct interconnect structure comprises only one programmable interconnect point.

20. The programmable logic device of claim 17, wherein said direct interconnect structure comprises a bus at least two bits wide.

21. The programmable logic device of claim 17, wherein:
each of said four logic blocks comprises a configurable logic element and an associated input multiplexer; and
each such logic block output can programmably drive, through said direct interconnect structure, the configurable logic element in each of the other three logic blocks by traversing one such associated input multiplexer.

22. The programmable logic device of claim 17, further comprising a programmable general interconnect structure.

23. A programmable logic device comprising an array of logic blocks arranged in rows and columns, said device comprising:
first, second, and third logic blocks, each logic block having at least one input and at least one output, said second logic block being adjacent to said first logic block, said third logic block not being adjacent to said first logic block, said first, second, and third logic blocks being not all in the same column and not all in the same row of said array; and
a direct interconnect structure connecting the output of said first logic block to the input of said second logic block and further to the input of said third logic block, the output of said second logic block to the input of said first logic block, and the output of said third logic block to the input of said first logic block.

24. The programmable logic device of claim 23, wherein a direct interconnect path implemented in said direct interconnect structure comprises only one programmable interconnect point.

25. The programmable logic device of claim 23, wherein said direct interconnect structure comprises a bus at least two bits wide.

26. The programmable logic device of claim 23, wherein:
each of said first, second, and third logic blocks comprises a configurable logic element and an associated input multiplexer; and
the first logic block output can programmably drive, through said direct interconnect structure, the configurable logic elements in said second and third logic blocks, the second logic block output can programmable drive, through said direct interconnect structure, the configurable logic element in said first logic block, and the third logic block output can programmably drive, through said direct interconnect structure, the configurable logic element in said first logic block.

27. The programmable logic device of claim 23, further comprising a programmable general interconnect structure.

28. A programmable logic device comprising an array of rows and columns of logic blocks, said device comprising:
at least four logic blocks not all adjacent to each other, not all in the same column, and not all in the same row in said array, each such logic block having at least one input and at least one output; and
a direct interconnect structure connecting each of said four logic blocks with each other of said four logic blocks, whereby each logic block output can programmably drive said at least one input of each of said other logic blocks.

29. The programmable logic device of claim 28, wherein said four logic blocks are positioned such that they form a square.

30. The programmable logic device of claim 28, wherein two of said four logic blocks are positioned such that they are adjacent to each other.

31. The programmable logic device of claim 28, wherein said four logic blocks are positioned such that a first two of said four logic blocks are adjacent to each other, and a second two of said four logic blocks are adjacent to each other.

32. The programmable logic device of claim 28, wherein a direct interconnect path implemented in said direct interconnect structure comprises only one programmable interconnect point.

33. The programmable logic device of claim 28, wherein said direct interconnect structure comprises a bus at least two bits wide.

34. The programmable logic device of claim 28, wherein:
each of said four logic blocks comprises a configurable logic element and an associated input multiplexer; and
each such logic block output can programmably drive, through said direct interconnect structure, the configurable logic element in each of the other three logic blocks by traversing one such associated input multiplexer.

35. The programmable logic device of claim 28, further comprising a programmable general interconnect structure.

36. A programmable logic device, comprising:
an array of logic blocks comprising a first logic block, the first logic block having two horizontally adjacent logic blocks, two vertically adjacent logic blocks, and four diagonally adjacent logic blocks; and a direct interconnect structure providing interconnections between the logic blocks, wherein:

the direct interconnect structure provides interconnections between the first logic block and each of the four diagonally adjacent logic blocks, and the direct interconnect structure further provides interconnections between the first logic block and at least one other logic block not adjacent to the first logic block.

37. The programmable logic device of claim 36, wherein:

the direct interconnect structure further provides interconnections between the first logic block and each of the two horizontally adjacent logic blocks; and the direct interconnect structure further provides interconnections between the first logic block and each of the two vertically adjacent logic blocks.

38. The programmable logic device of claim 36, wherein a direct interconnect path implemented in the direct interconnect structure comprises only one programmable interconnect point.

39. The programmable logic device of claim 36, wherein the direct interconnect structure comprises a bus at least two bits wide.

40. The programmable logic device of claim 36, further comprising a programmable general interconnect structure.

* * * * *